United States Patent
Burgan et al.

(10) Patent No.: US 8,045,721 B2
(45) Date of Patent: Oct. 25, 2011

(54) DYNAMIC DISTORTION ELIMINATION FOR OUTPUT AUDIO

(75) Inventors: John M. Burgan, North Palm Beach, FL (US); Jose E. Korneluk, Lake Worth, FL (US); Glenn R. Nelson, Boynton Beach, FL (US); Marco Pulido, Miramar, FL (US)

(73) Assignee: Motorola Mobility, Inc., Libertyville, IL (US)

( * ) Notice: Subject to any disclaimer, the term of this patent is extended or adjusted under 35 U.S.C. 154(b) by 1290 days.

(21) Appl. No.: 11/611,108

(22) Filed: Dec. 14, 2006

(65) Prior Publication Data
US 2008/0144843 A1    Jun. 19, 2008

(51) Int. Cl.
*H03G 3/20*    (2006.01)

(52) U.S. Cl. ............ 381/57; 381/98; 381/101; 381/102; 381/103; 381/56; 379/390.01

(58) Field of Classification Search .................... 381/57, 381/106, 108, 104, 86, 98, 101, 102, 103, 381/56; 379/388.01–390.04
See application file for complete search history.

(56) References Cited

U.S. PATENT DOCUMENTS

| | | | | |
|---|---|---|---|---|
| 5,081,682 | A | * | 1/1992 | Kato et al. ............... 381/57 |
| 6,504,935 | B1 | * | 1/2003 | Jackson ............... 381/61 |
| 2005/0213780 | A1 | | 9/2005 | Berardi et al. |

* cited by examiner

*Primary Examiner* — Vivian Chin
*Assistant Examiner* — Paul Kim

(57) ABSTRACT

A method (200) for improving quality of output audio (126). The method can include detecting an output acoustic signal (128) and generating a receive audio signal (134) based, at least in part, on the detected output acoustic signal. A frequency domain representation (140) of the receive audio signal can be compared to a frequency domain representation (138) of a source audio signal (124) from which the output acoustic signal is generated. At least one distortion signal (142) in the receive audio signal can be identified, and the source audio signal can be selectively equalized to reduce an amplitude of the source audio signal at a frequency that correlates to the distortion signal.

22 Claims, 2 Drawing Sheets

DYNAMIC DISTORTION ELIMINATION FOR OUTPUT AUDIO

BACKGROUND OF THE INVENTION

1. Field of the Invention

The present invention generally relates to audio signal processing.

2. Background of the Invention

The design of high volume output audio transducers (e.g. loudspeakers) for small electronic devices is complicated. Small size restrictions in a mobile station, for example, typically limit the acoustic design to using only a very small output audio transducer. Nonetheless, high output audio levels are required to use the mobile station in speakerphone mode, which necessitates driving the output audio transducer with relatively high power. In this situation, it is not uncommon to have mechanical components within mobile station housing resonate due to vibration of the output audio transducer, which distorts the net sound being emanated by the mobile station.

In an attempt to minimize the effect of resonances, a designer of an electronic device may implement conventional equalization techniques to equalize audio output signals in order to reduce output audio volume at frequencies at which device components are known to resonate. However, the resonant frequencies of these components can vary from one device to another due to variations in manufacturing tolerances. Moreover, the resonant frequencies tend to shift over time due to components of the device loosening, grommets decaying, and general aging of the device. Thus, the use of conventional equalization techniques fails to insure long term acceptable sound quality from a small electronic device.

SUMMARY OF THE INVENTION

The present invention relates to a method for improving quality of output audio. The method can include detecting an output acoustic signal and generating a receive audio signal based, at least in part, on the detected output acoustic signal. The output acoustic signal can be generated via an output audio transducer of the device and detecting the output acoustic signal can include detecting the output acoustic signal via an input audio transducer of a device. Generating the receive audio signal further can include generating the receive audio signal based, at least in part, on a secondary acoustic signal generated by vibration of at least one device component.

A frequency domain representation of the receive audio signal can be compared to a frequency domain representation of a source audio signal from which the output acoustic signal is generated. Comparing the frequency domain representation of the receive audio signal to the frequency domain representation of the source audio signal can include, for example, measuring a difference between the frequency domain representation of the receive audio signal and the frequency domain representation of the source audio signal.

At least one distortion signal in the receive audio signal can be identified, and the source audio signal can be selectively equalized to reduce an amplitude of the source audio signal at a frequency that correlates to the distortion signal. Dynamically equalizing the source audio signal can include updating at least one gain weighting factor for the frequency that correlates to the distortion signal. The method further can include selectively returning the gain weighting factor to a previous value in response to the distortion signal subsiding.

The method further can include identifying a correlation between the distortion signal and the source audio signal by comparing a frequency domain representation of the distortion signal to the frequency domain representation of the source audio signal. Identifying the correlation between the distortion signal and the source audio signal can include identifying frequency content in the source audio signal of which the distortion signal is a harmonic or a sub-harmonic.

A Fast Fourier Transform can be performed on the receive audio signal to generate the frequency domain representation of the receive audio signal. Similarly, a Fast Fourier Transform can be performed on the source audio signal to generate the frequency domain representation of the source audio signal.

The present invention also relates to an audio processing system that includes an input audio transducer that detects an output acoustic signal. The audio processing system also can include an output audio transducer that generates the output acoustic signal. Further, the audio processing system can include an analog-to-digital converter that generates a receive audio signal based, at least in part, on the detected output acoustic signal. The analog-to-digital converter also can generate the receive audio signal based, at least in part, on a secondary acoustic signal generated by vibration of at least one device component.

The audio processing system also can include a comparator that compares a frequency domain representation of the receive audio signal to a frequency domain representation of a source audio signal from which the output acoustic signal is generated. The comparator can measure a difference between the frequency domain representation of the receive audio signal and the frequency domain representation of the source audio signal.

Further, the audio processing system can include a harmonic analyzer that identifies at least one distortion signal in the receive audio signal and a dynamic equalizer that selectively equalizes the source audio signal to reduce an amplitude of the source audio signal at a frequency that correlates to the distortion signal. The harmonic analyzer can update at least one gain weighting factor for the frequency that correlates to the distortion signal. The harmonic analyzer can identify a correlation between the distortion signal and the source audio signal by comparing a frequency domain representation of the distortion signal to the frequency domain representation of the source audio signal. The harmonic analyzer also can identify frequency content in the source audio signal of which the distortion signal is a harmonic or a sub-harmonic.

The audio processing system further can include a Fast Fourier Transform module that performs a Fast Fourier Transform on the receive audio signal to generate the frequency domain representation of the receive audio signal. The Fast Fourier Transform module also can perform a Fast Fourier Transform on the source audio signal to generate the frequency domain representation of the source audio signal.

The present invention also can be embedded in a program storage device readable by a machine, tangibly embodying a program of instructions executable by the machine to perform the various steps described herein.

BRIEF DESCRIPTION OF THE DRAWINGS

Preferred embodiments of the present invention will be described below in more detail, with reference to the accompanying drawings, in which.

DETAILED DESCRIPTION

While the specification concludes with claims defining features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The present invention relates to a method and a system for improving quality of output audio generated by a device. In particular, an acoustic signal generated by the device can be received by an input audio transducer and compared to a source audio signal from which the acoustic signal was generated. A distortion signal in a receive audio signal can be identified and correlated to one or more frequencies of the source audio signal that are responsible for excitation of the distortion signal. The source audio signal then can be dynamically equalized to reduce the amplitude of the source audio signal at the frequencies correlating to the distortion signal, thereby reducing the amplitude of the distortion signal. Notably, the distortion signal can be a harmonic or a sub-harmonic of the correlating frequency (or frequency band).

Figure 1:
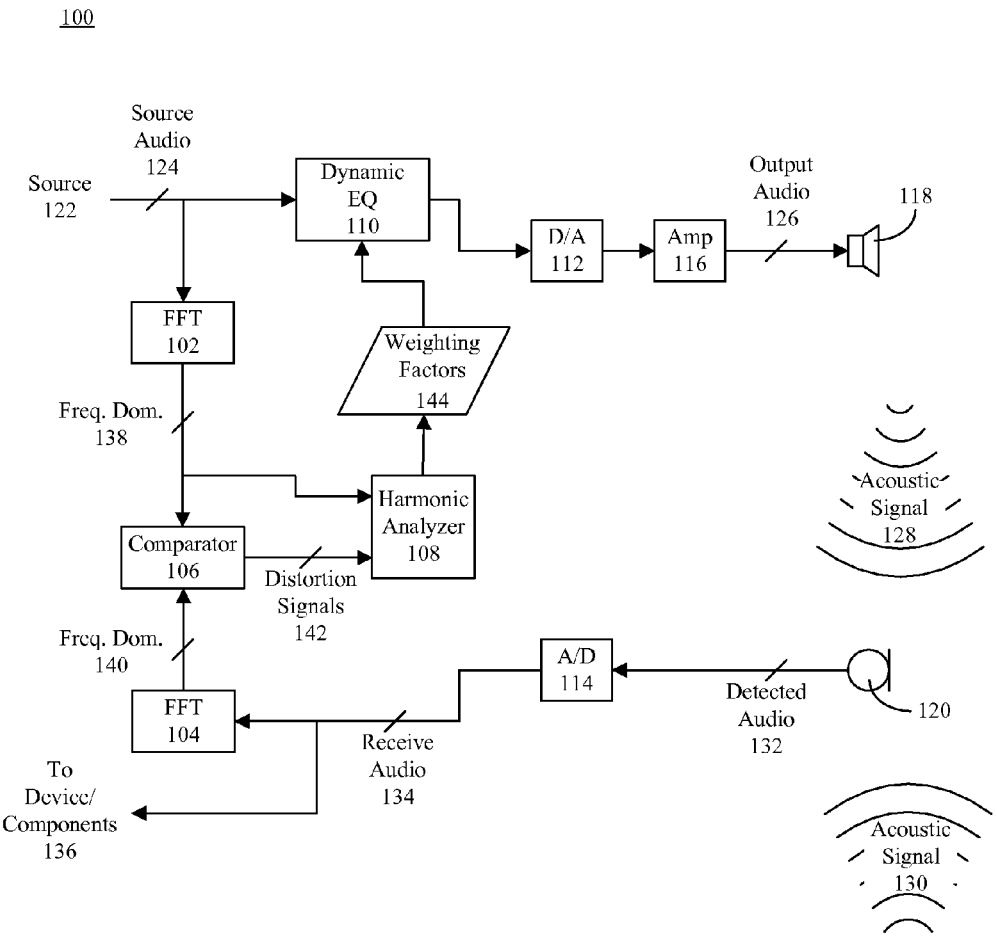
FIG. 1 depicts a block diagram of an audio signal processing circuit that is useful for understanding the present invention.

FIG. 1 depicts a block diagram of an audio signal processing system (hereinafter "system") 100 that is useful for understanding the present invention. The system 100 can be a component of a device or system that generates acoustic signals. For example, the system 100 can be a component of an audio system (e.g. stereo system or surround sound system), a public address system, an intercom system, a television, a computer, a mobile station, and so on.

The system 100 can comprise one or more Fast Fourier Transform (FFT) modules 102, 104, a comparator 106, a harmonic analyzer 108, and a dynamic equalizer 110. Such components 102-110 can be implemented purely in hardware, or a combination of hardware and software. For example, the Fast Fourier Transform (FFT) modules 102, 104, comparator 106, harmonic analyzer 108, and dynamic equalizer 110 can be implemented by executing suitable program code in a processing system. Such a system can comprise, for example, one or more central processing units (CPUs), one or more digital signal processors (DSPs), one or more application specific integrated circuits (ASICs), one or more programmable logic devices (PLDs), a plurality of discrete components that can cooperate to process data, and/or any other suitable processing device. In an arrangement in which a plurality of such components are provided, the components can be coupled together to perform various processing functions as described herein.

The system 100 also can include a digital-to-analog (D/A) converter 112, an analog-to-digital (A/D) converter 114, an audio amplifier 116, an output audio transducer 118 (e.g. a loudspeaker) and an input audio transducer 120 (e.g. a microphone). Such components are well known to the skilled artisan.

In operation, a source audio signal 124 from a signal source 122 can be processed by the dynamic equalizer 110, the D/A converter 112 and the audio amplifier 116 to generate an output audio signal 126 that can be applied to the output audio transducer 118 to generate an acoustic signal 128. The input audio transducer 120 can detect the acoustic signal 128, along with other secondary acoustic signals 130 generated by the device in which the system 100 is incorporated and/or other proximate devices, to generate an analog detected audio signal 132. The A/D converter 114 can perform analog-to-digital conversion on the detected audio signal 132 to generate a receive audio signal 134. The receive audio signal 134 can be communicated to any other components or devices 136 that may use such a signal.

In addition, the source audio 124 can be applied to the FFT module 102 and the receive audio 134 can be applied to the FFT module 104. The FFT module 102 can perform FFT on the source audio signal 124 to generate a frequency domain representation 138 of the source audio 124. Similarly, the FFT module 104 can perform FFT on the receive audio signal 134 to generate a frequency domain representation 140 of the receive audio 134. In one arrangement, the functions of the FFT 102 and FFT 104 can be performed by a single FFT module or algorithm that is applied to process the respective signals 124, 134.

The comparator 106 can compare the frequency domain representation 138 to the frequency domain representation 140 to identify one or more distortion signals 142 in the receive audio signal 134. The distortion signals 142 can be caused by interference from the acoustic signal 130 or non-linearities in the conversion of the output audio signal 126 to the acoustic signal 128. Such non-linearities can be caused, for instance, by clipping of the amplifier 116 and/or driving the output audio transducer 118 beyond its ability to perform linear signal conversion.

By way of example, certain frequency bands in the acoustic signal 128 can excite one or more components of a device in which the output audio transducer 118 is mounted. Such components can vibrationally resonate to generate a secondary acoustic signal, such as the acoustic signal 130. When a component resonates in this manner, the acoustic signal 130 may comprise one or more signals in distinct frequency bands (i.e. resonances) having a significantly greater amplitude than other signal content outside the frequency bands. Oftentimes a resonance can occur at a harmonic or a sub-harmonic of a signal frequency that caused the resonance, though this is not always the case and the resonance also can occur at the same signal frequency that caused the resonance.

In another example, assume the output audio transducer 118 is very small, yet generates high volume output audio for a mobile station (e.g. mobile radio or mobile telephone) while the mobile station is in speakerphone mode. In order to generate sufficient acoustic volume, the output audio transducer 118 may be driven beyond its linear operational range, thereby resulting in distortions of the acoustic signal 128. Such distortions may result in certain frequencies in the acoustic signal 128 being accentuated. As the amplitude of the output audio signal 126 is increased, the frequency of the distortions may shift and the amplitude of the distortions may increase. Thus, the distortion signals 142 likely are not static and may change significantly during use of the mobile station.

The distortion signals 142 identified by the comparator 106 can be communicated to the harmonic analyzer 108. The harmonic analyzer 108 can compare the distortion signals 142 to the frequency domain representation 138 of the source audio signal 124 in order to identify a correlation between the distortion signals 142 and the frequency content of the source audio signal 124. As noted, the distortion signals 142 may be harmonics or sub-harmonics of such frequency content, or may be at substantially the same frequencies.

In illustration, assume the receive audio signal 134 contains substantial energy in a frequency band centered around 1500 Hz that is not present in the source audio signal 124. The comparator 106 can detect this difference between the source audio 124 and the receive audio signal 134 and report the difference to the harmonic analyzer 108 as a distortion signal 142. Also assume that the amplitude of the distortion signal 142 increases significantly when the amplitude of the source audio signal 124 in a frequency band centered at 500 Hz increases, and the amplitude of the distortion signal 142 decreases significantly when the amplitude of the source audio signal 124 at 500 Hz decreases. The harmonic analyzer 108 can identify that the frequency band centered at 500 Hz may contribute significantly to the distortion signal 142. Such identification can be performed using a suitable algorithm that identifies correlations between frequencies or frequency bands in the source audio signal 124 and frequencies or frequency bands in the distortion signals 142.

Frequencies in the source audio signal 124 that are identified by the harmonic analyzer 108 as potentially contributing to the distortion signals 142 can be communicated to the dynamic equalizer 110. The dynamic equalizer 110 can equalize the source audio signal 124 until the amplitudes of correlating distortion signals 142 are below a threshold value. The threshold value can be determined, for example, by an acceptable level of distortion, or in any other suitable manner.

To equalize the source audio signal 124, the dynamic equalizer 110 can automatically reduce the amplitude of the source audio signal 124 at the identified distortion frequencies. In one arrangement, the amount of signal reduction can be proportional to the amplitude of the distortion signals 142. The signal reduction can be implemented by reducing signal weighting factors 144 used by the dynamic equalizer 110 to equalize the source audio signal 124. The signal weighting factors 144 can determine the signal gain applied by the dynamic equalizer 110 at the distortion frequencies. In one aspect of the invention, a data file or data table containing the signal weighting factors 144 can be automatically updated by the harmonic analyzer 108 in real time when distortion signals 142 are detected. As used herein, the term "real time" means a level of processing responsiveness that a user senses as sufficiently immediate or that enables the processor to keep up with some external process.

Expanding on the previous example in which signals in a frequency band centered at 500 Hz contribute to distortion at 1500 Hz, the amplitude of the distortion at 1500 Hz can be measured. If, in comparison to the frequency domain representation 138 of the source audio signal 124, the distortion at 1500 Hz contributes an additional 10 dB of energy to the detected audio signal 132, the signal weighting factor 144 for the frequency band centered at 500 Hz can be dynamically adjusted to reduce the gain of the source audio signal 124 by 10 dB at 500 Hz. To determine how much energy the distortion signal 142 contributes to the detected audio signal 132, the harmonic analyzer 108 can compare the relative amplitude of the distortion signal 142 to the relative amplitude of the source audio signal 124 at the frequency of the distortion signal 142.

The harmonic analyzer 108 can control the weighting factors 144 for the equalizer 110 and can reduce gains at any frequency contributing to distortions in the receive audio 134. The harmonic analyzer 108 also can selectively return the weighting factors 144 to previous values in response to the distortion 142 subsiding, thereby insuring that the output acoustic signal 128 generated by the output audio transducer 118 highly correlates to the source audio signal 124.

Figure 2:
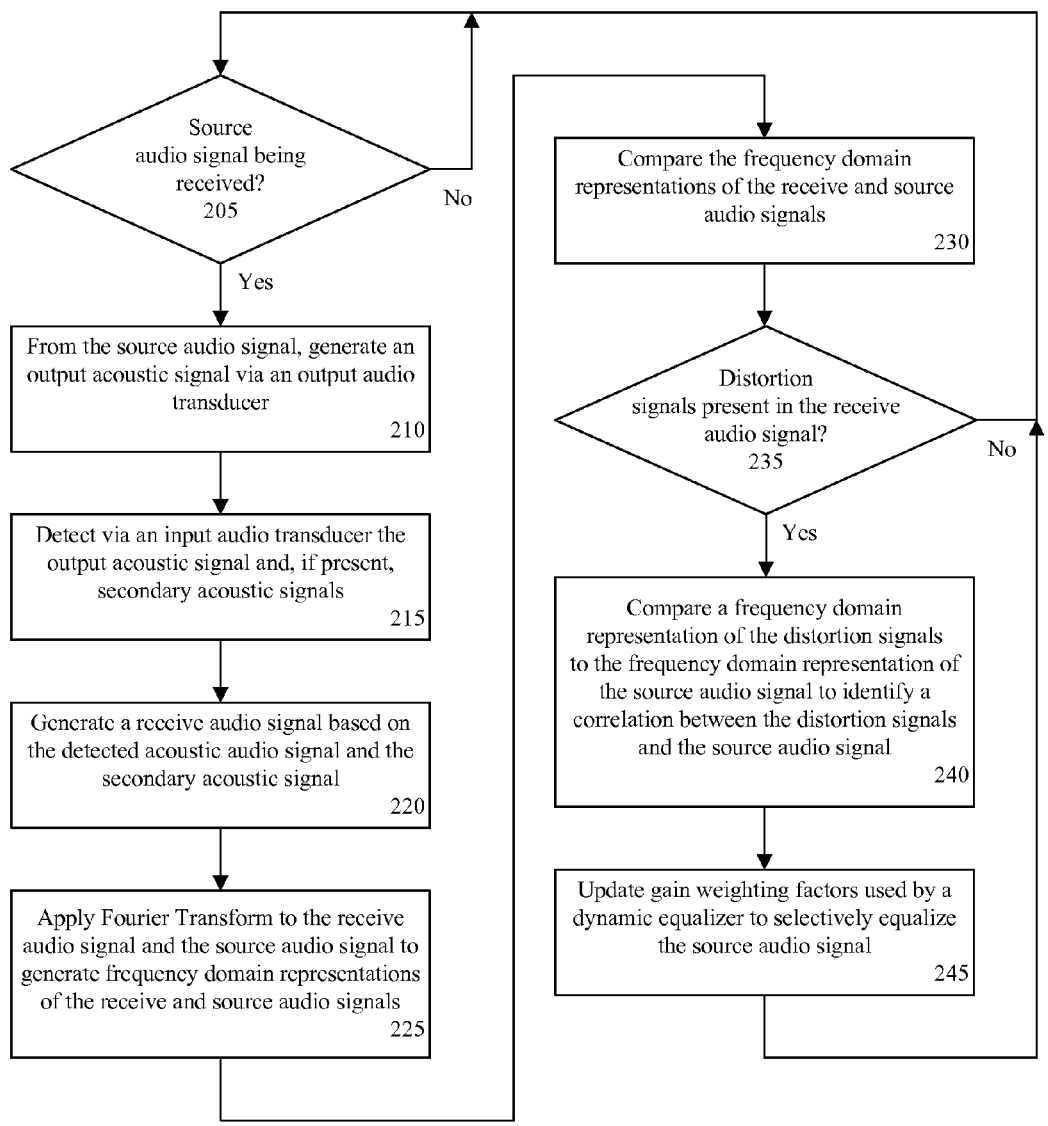
FIG. 2 is a flowchart that is useful for understanding the present invention.

FIG. 2 is a flowchart presenting a method 200 that is useful for understanding the present invention. Referring to decision box 205, if a source audio signal is being received by an audio processing system, at step 210 an output acoustic signal can be generated from the source audio signal via an output audio transducer. At step 215, the output acoustic signal can be detected by an input audio transducer and a detected audio signal can be generated. Any secondary acoustic signals also can be detected and included in the detected audio signal. The secondary acoustic signals can be, for instance, those due to vibrations of the device in which the audio processing system is incorporated and/or other proximate devices.

At step 220, a receive audio signal can be generated from the detected audio signal. For example, analog-to-digital conversion can be applied to the detected audio signal to generate the receive audio signal. Proceeding to step 225, a Fourier Transform can be applied to the receive audio signal to generate a frequency domain representation of the signal. Similarly, a Fourier Transform can be applied to the source audio signal to generate a frequency domain representation of it. In one arrangement, the Fourier Transforms that are used can be Fast Fourier Transforms.

At step 230, the frequency domain representations of the receive audio signal and the source audio signal can be compared to identify whether distortion signals are present in the receive audio signal. Referring to decision box 235, if distortion signals are not present, the process can return to decision box 205. In one arrangement, if equalization gain weighting factors have been applied to reduce a distortion signal that is no longer present, the gain weighting factors adjusted to reduce the distortion signal can be changed back to default values. In one arrangement, such changes can be implemented incrementally and the frequency of the distortion signal can be monitored. If the distortion signal again reappears, the incremental adjustment can be ceased.

If, however, distortion signals are present in the receive audio signal, at step 240 a frequency domain representation of the distortion signals can be compared to the frequency domain representation of the source audio signal in order to identify a correlation between the distortion signals and the source audio signal. In particular, frequencies in the source audio signal that are responsible for the distortion signals can be identified. The identified frequencies can be the same frequencies that comprise of the distortion signals, or the distortion signals can be harmonics and/or sub-harmonics of identified frequencies. Continuing to step 245, gain weighting factors used by a dynamic equalizer can be updated to selectively equalize the source audio signal in order to reduce the amplitude of the output acoustic signal at the identified frequencies.

The present invention can be realized in hardware, software, or a combination of hardware and software. The present invention can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with an application that, when being loaded and executed, controls the processing system such that it carries out the methods described herein. The present invention also can be embedded in a program storage device readable by a machine, tangibly embodying a program of instructions executable by the machine to perform methods and processes described herein. The present invention also can be embedded in an application product which comprises all the features enabling the implementation of the methods described herein and, which when loaded in a processing system, is able to carry out these methods.

The terms "computer program," "software," "application," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, an application can include, but is not limited to, a subroutine, a function, a procedure, an object method, an object implementation, an executable application, an applet, a servlet, a MIDlet, a source code, an object code, a shared library/dynamic load library and/or other sequence of instructions designed for execution on a processing system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language).

This invention can be embodied in other forms without departing from the spirit or essential attributes thereof. Accordingly, reference should be made to the following claims, rather than to the foregoing specification, as indicating the scope of the invention.

What is claimed is:

1. A method for improving quality of output audio, comprising:
    detecting an output acoustic signal;
    generating a receive audio signal based, at least in part, on the detected output acoustic signal;
    comparing a frequency domain representation of the receive audio signal to a frequency domain representation of a source audio signal from which the output acoustic signal is generated;
    identifying at least one distortion signal in the receive audio signal; and
    selectively equalizing the source audio signal to reduce an amplitude of the source audio signal at a frequency that correlates to the distortion signal.

2. The method of claim 1, further comprising identifying a correlation between the distortion signal and the source audio signal by comparing a frequency domain representation of the distortion signal to the frequency domain representation of the source audio signal.

3. The method of claim 2, wherein identifying the correlation between the distortion signal and the source audio signal comprises identifying frequency content in the source audio signal of which the distortion signal is a harmonic or a sub-harmonic.

4. The method of claim 1, wherein generating the receive audio signal further comprises generating the receive audio signal based, at least in part, on a secondary acoustic signal generated by vibration of at least one device component.

5. The method of claim 1, wherein comparing the frequency domain representation of the receive audio signal to the frequency domain representation of the source audio signal comprises measuring a difference between the frequency domain representation of the receive audio signal and the frequency domain representation of the source audio signal.

6. The method of claim 1, further comprising performing a Fast Fourier Transform on the receive audio signal to generate the frequency domain representation of the receive audio signal.

7. The method of claim 1, further comprising performing a Fast Fourier Transform on the source audio signal to generate the frequency domain representation of the source audio signal.

8. The method of claim 1, wherein dynamically equalizing the source audio signal comprises updating at least one gain weighting factor for the frequency that correlates to the distortion signal.

9. The method of claim 8, further comprising selectively returning the gain weighting factors to a previous value in response to the distortion signal subsiding.

10. The method of claim 1, wherein detecting the output acoustic signal comprises detecting the output acoustic signal via an input audio transducer of a device.

11. The method of claim 10, further comprising generating the output acoustic signal via an output audio transducer of the device.

12. An audio processing system, comprising:
    an input audio transducer that detects an output acoustic signal;
    an analog-to-digital converter that generates a receive audio signal based, at least in part, on the detected output acoustic signal;
    a comparator that compares a frequency domain representation of the receive audio signal to a frequency domain representation of a source audio signal from which the output acoustic signal is generated;
    a harmonic analyzer that identifies at least one distortion signal in the receive audio signal; and
    a dynamic equalizer that selectively equalizes the source audio signal to reduce an amplitude of the source audio signal at a frequency that correlates to the distortion signal.

13. The audio processing system of claim 12, wherein the harmonic analyzer identifies a correlation between the distortion signal and the source audio signal by comparing a frequency domain representation of the distortion signal to the frequency domain representation of the source audio signal.

14. The audio processing system of claim 13, wherein the harmonic analyzer identifies frequency content in the source audio signal of which the distortion signal is a harmonic or a sub-harmonic.

15. The audio processing system of claim 12, wherein the analog-to-digital converter generates the receive audio signal based, at least in part, on a secondary acoustic signal generated by vibration of at least one device component.

16. The audio processing system of claim 12, wherein the comparator measures a difference between the frequency domain representation of the receive audio signal and the frequency domain representation of the source audio signal.

17. The audio processing system of claim 12, further comprising a Fast Fourier Transform module that performs a Fast Fourier Transform on the receive audio signal to generate the frequency domain representation of the receive audio signal and performs a Fast Fourier Transform on the source audio signal to generate the frequency domain representation of the source audio signal.

18. The audio processing system of claim 12, wherein the harmonic analyzer updates at least one gain weighting factor for the frequency that correlates to the distortion signal.

19. The audio processing system of claim 12, further comprising an output audio transducer that generates the output acoustic signal.

20. A program storage device readable by a machine, tangibly embodying a program of instructions executable by the machine to perform method steps for improving quality of output audio, said method steps comprising:
- detecting an output acoustic signal via an input audio transducer;
- generating a receive audio signal based, at least in part, on the detected output acoustic signal;
- comparing a frequency domain representation of the receive audio signal to a frequency domain representation of a source audio signal from which the output acoustic signal is generated;
- identifying at least one distortion signal in the receive audio signal; and
- selectively equalizing the source audio signal to reduce an amplitude of the source audio signal at a frequency that correlates to the distortion signal.

21. A mobile station, comprising:
- an input audio transducer that detects an output acoustic signal;
- an analog-to-digital converter that generates a receive audio signal based, at least in part, on the detected output acoustic signal;
- a comparator that compares a frequency domain representation of the receive audio signal to a frequency domain representation of a source audio signal from which the output acoustic signal is generated;
- a harmonic analyzer that identifies at least one distortion signal in the receive audio signal; and
- a dynamic equalizer that selectively equalizes the source audio signal to reduce an amplitude of the source audio signal at a frequency that correlates to the distortion signal.

22. The communication device of claim 21, further comprising:
- an output audio transducer that generates the output acoustic signal.

* * * * *